United States Patent
Lenox

(10) Patent No.: US 6,862,817 B1
(45) Date of Patent: Mar. 8, 2005

(54) METHOD AND APPARATUS FOR KINEMATIC REGISTRATION OF A RETICLE

(75) Inventor: Richard J. Lenox, Trumbull, CT (US)

(73) Assignee: ASML Holding N.V., Veldhoven (NL)

(*) Notice: Subject to any disclaimer, the term of this patent is extended or adjusted under 35 U.S.C. 154(b) by 0 days.

(21) Appl. No.: 10/704,900

(22) Filed: Nov. 12, 2003

(51) Int. Cl.[7] .............................................. G01D 21/00
(52) U.S. Cl. ............................ 33/623; 33/621; 33/613; 33/645
(58) Field of Search ......................... 33/613, 621, 623, 33/645

(56) References Cited

U.S. PATENT DOCUMENTS

| | | | | |
|---|---|---|---|---|
| 1,912,547 A | * | 6/1933 | Smith et al. .................. | 33/615 |
| 3,695,760 A | * | 10/1972 | Orr .............................. | 355/95 |
| 4,408,830 A | * | 10/1983 | Wutherich .................. | 359/813 |
| 4,530,635 A | | 7/1985 | Engelbrecht et al. | |
| 4,667,415 A | * | 5/1987 | Barsky ......................... | 33/568 |
| 4,719,705 A | | 1/1988 | Laganza et al. | |
| 4,760,429 A | | 7/1988 | O'Connor | |
| 4,778,332 A | | 10/1988 | Byers et al. | |
| 4,907,035 A | | 3/1990 | Galburt et al. | |
| 4,986,007 A | * | 1/1991 | Laganza et al. .............. | 33/621 |
| 5,161,789 A | * | 11/1992 | Rogers ......................... | 269/42 |
| 5,193,972 A | | 3/1993 | Engelbrecht | |
| 5,296,893 A | * | 3/1994 | Shaw et al. ................... | 355/75 |
| 5,311,250 A | * | 5/1994 | Suzuki et al. ................. | 355/76 |
| 5,529,819 A | * | 6/1996 | Campi, Jr. .................... | 428/14 |
| 5,727,685 A | | 3/1998 | Laganza et al. | |
| 6,216,873 B1 | * | 4/2001 | Fosnight et al. ............. | 206/710 |
| 6,239,863 B1 | * | 5/2001 | Catey et al. .................. | 355/75 |
| 6,317,197 B1 | * | 11/2001 | Li et al. ....................... | 355/74 |
| 6,364,595 B1 | * | 4/2002 | Bonora et al. ........... | 414/416.1 |

(List continued on next page.)

OTHER PUBLICATIONS

U.S. Appl. No. 10/901,188, filed Jul. 29, 2004, Lenox et al.

*Semi E100–0302$^E$ Specification for a Reticle SMIF POD (RSP) Used to Transport and Store 6 Inch or 230 mm Reticles,* Copyright 2000, 2003 by Semiconductor Equipment and Materials International, 14 pages.

*Semi E111–0304 Provisional Mechanical Specification for a 150 mm Reticle SMIF POD (RSP150) Used to Transport and Store a 6 Inch Reticle,* Copyright 2001, 2004 by Semiconductor Equipment and Materials International, 14 pages.

*Semi E112–0303 Provisional Mechanical Specification for a 150 mm Multiple Reticle SMIF POD (MRSP150) Used to Transport and Store Multiple 6 Inch Reticles,* Copyright 2001, 2003 by Semiconductor Equipment and Materials International, 14 pages.

Primary Examiner—Christopher W. Fulton
Assistant Examiner—Yaritza Guadalupe
(74) Attorney, Agent, or Firm—Sterne, Kessler, Goldstein & Fox P.L.L.C.

(57) ABSTRACT

An improved reticle frame structure surrounds the perimeter of a reticle substrate and contacts it at the edge with precision guidance surfaces as the reticle is lowered onto the device. In an embodiment, the reticle contacts conical sections that correct its position and orientation along the plane of its mask surface, and spherical surfaces to position the reticle at its standardized datum reference areas. Near the intersection of the X and Y reference planes, a minimal area of the reticle face comes to rest on a spherical mounting surface as far away from the reticle mask as possible. This surface completes a tripod of vertical support in conjunction with the cones, which maintain contact with the reticle edges only. Secondary and tertiary spherical support surfaces can be provided for vertical support of the other two lateral corners of the reticle face to mitigate reticle tilt while it is being lowered onto the tripod contact points.

43 Claims, 5 Drawing Sheets

U.S. PATENT DOCUMENTS

| | | |
|---|---|---|
| 6,513,654 B2 * | 2/2003 | Smith et al. ................ 206/454 |
| 6,515,736 B1 * | 2/2003 | Hayden et al. ............... 355/75 |
| 6,619,359 B2 * | 9/2003 | Ballard et al. .............. 156/366 |
| 6,736,386 B1 * | 5/2004 | Parker ....................... 269/285 |
| 2003/0129051 A1 | 7/2003 | Friedman et al. |
| 2003/0218728 A1 * | 11/2003 | del Puerto et al. ............ 355/51 |
| 2004/0021846 A1 * | 2/2004 | Greene et al. ................. 355/75 |
| 2004/0057030 A1 * | 3/2004 | Okubo et al. ................. 355/53 |

* cited by examiner

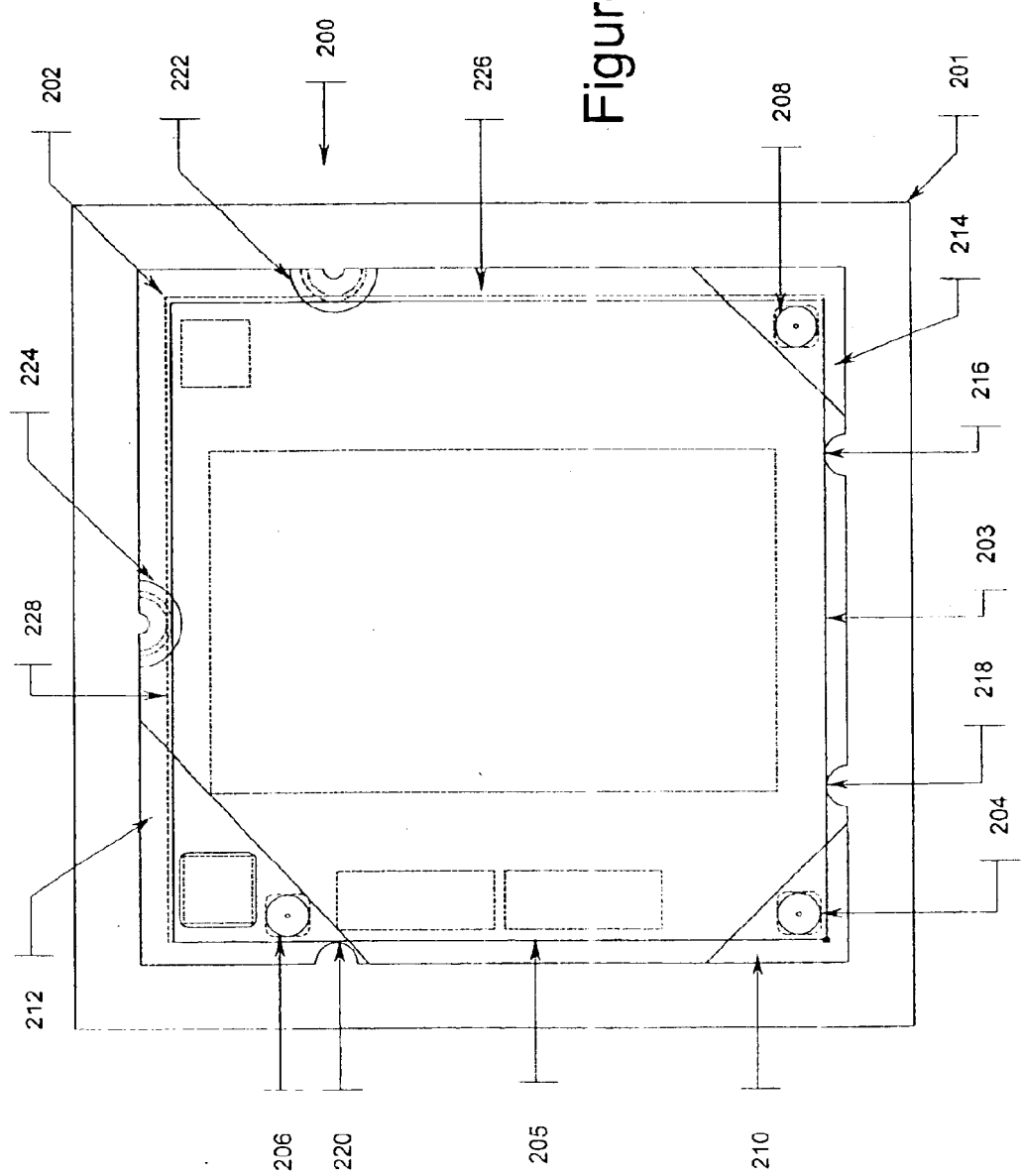

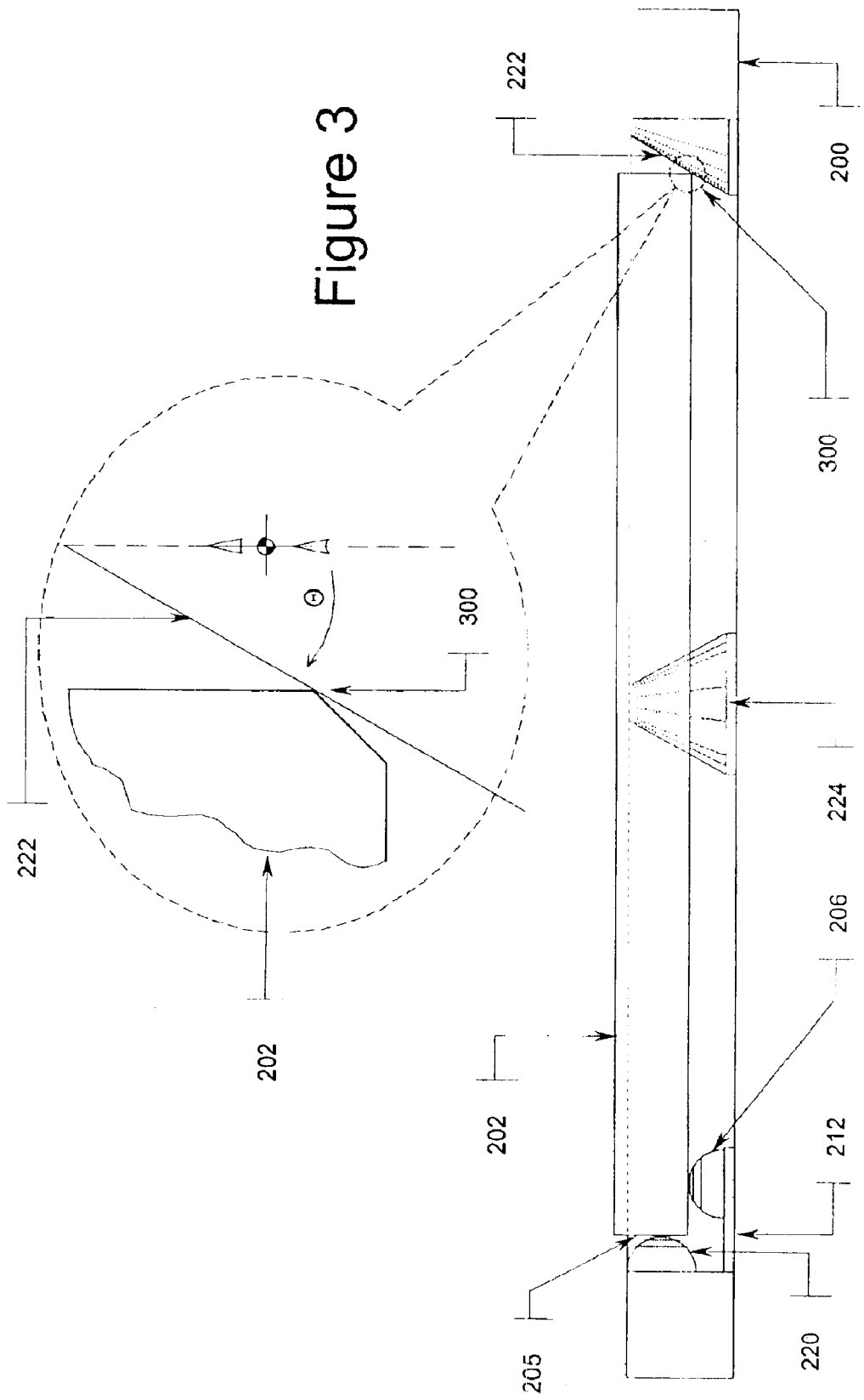

METHOD AND APPARATUS FOR KINEMATIC REGISTRATION OF A RETICLE

BACKGROUND OF THE INVENTION

1. Field of the Invention

The present invention is generally related to lithography systems, and more particularly, to reticle positioning devices in a lithography system.

2. Background Art

Lithography is a process used to create features on a surface of a substrate. The substrate can include those used in the manufacture of flat panel displays, circuit boards, various integrated circuits, and the like. A semiconductor wafer, for example, can be used as a substrate to fabricate an integrated circuit.

During lithography, a reticle is used to transfer a desired pattern onto a substrate. The reticle can be formed of a material transparent to a lithographic wavelength being used, for example glass in the case of visible light. The reticle can also be formed to reflect a lithographic wavelength being used, for example extreme ultraviolet (EUV) light. The reticle has an image printed on it. The size of the reticle is chosen for the specific system in which it is used. A reticle six inches by six inches and one-quarter inch thick can be used, for example. During lithography, a wafer, which is disposed on a wafer stage, is exposed to an image projected onto the surface of the wafer corresponding to the image printed on the reticle.

The projected image produces changes in the characteristics of a layer, for example a resist layer, deposited on the surface of the wafer. These changes correspond to the features projected onto the wafer during exposure. Subsequent to exposure, the layer can be etched to produce a patterned layer. The pattern corresponds to those features projected onto the wafer during exposure. This patterned layer is then used to remove exposed portions of underlying structural layers within the wafer, such as conducting, semiconducting, or insulating layers. This process is then repeated, together with other steps, until the desired features have been formed on the surface of the wafer.

As should be clear from the above discussion, the accurate location and size of features produced through lithography is directly related to the precision and accuracy of the image projected onto the wafer. The rigors of sub-100 nm lithography place stringent demands not only on the lithography tool, but also on the reticle. Airborne particles and dust that settle on the reticle can cause defects on the wafer. Small image distortions or displacements in the reticle plane can swamp critical dimension and overlay error budgets. A conventional solution is to use a thin piece of permanently fixed transparent material as a pellicle for the reticle.

This pellicle remains in place during all stages of the lithography process. A pellicle has a dual role in improving the accuracy of the image projected onto a wafer. First, a pellicle serves to protect the reticle from direct contact with particulate contamination. As discussed above, particles that settle on the reticle can produce image distortion, so they must be removed. However, removal of particles from the reticle can cause damage to the reticle because such removal may involve direct contact with the reticle. When a pellicle is used, particles will settle on the pellicle rather than the reticle. Thus, it is the pellicle that must be cleaned. Cleaning the pellicle rather than the reticle poses fewer dangers to the integrity of the reticle since the reticle is protected during this cleaning by the pellicle itself.

The second role played by a pellicle is related to the standoff of the pellicle. During exposure, the focal plane corresponds to the location of the image printed on the reticle. By including a pellicle, any particles in the system will settle on the pellicle rather than the reticle. By virtue of the thickness of the pellicle, and thus the distance between the surface of the pellicle and the patterned surface of the reticle, these particles will not be in the focal plane. Since the pellicle lifts the particles out of the focal plane, the probability that the image projected onto the substrate will include these particles is greatly reduced.

The pellicle solution works well in many conventional lithographic processing techniques. Since materials are available for producing transparent pellicles and reticles, the use of such a system is convenient in, for example, a system in which light must pass through both the reticle and the pellicle. The pellicle approach, however, is not well suited for use in extreme-ultraviolet (EUV) applications because there are no materials sufficiently transparent to EUV that can be used to make a pellicle. In EUV Lithography, light does not pass through the reticle, but is reflected off the object side of the reticle in a technique known as reflective lithography. If a pellicle were to be used in a reflective process, the EUV would necessarily pass through the pellicle twice; once on the way onto the reticle and again after reflecting off of the reticle. Thus, any amount of light absorbed from the pellicle would be effectively doubled if a pellicle were used in EUV processing techniques. In order to conserve enough light to perform photo-exposure with any measure of efficiency, EUV lithography preferably uses reticles without pellicles.

In the absence of a pellicle, contaminants will land on the surface of a mask and degrade the quality of the image reflected onto the wafers produced in EUV applications. Many techniques have been employed to reduce the number of contaminants that can land on a mask, in particular; extreme care is taken to ensure a clean environment around the mask, as well as to minimize the settling of any debris onto the mask area. For example, in addition to clean room environments and operating within a vacuum, such reticles are typically transported mask side down.

Nonetheless, particulate contaminants exist that could adhere to a mask; whether they are airborne in a clean environment or scattering through a vacuum. In particular, contact spots on a reticle used to hold it and transport it within the lithographic system can generate sub-microscopic fracture particles that can land on the mask as contaminants or debris. One type of contact spot is a region on a reticle that is physically touched by robotic devices, end effectors, grippers, or the like, to move and position the reticle. What is needed is an intermediary device that will interface with any robotic end effectors, grippers, or the like, in place of the reticle, while holding and securing the reticle with minimal contact to it.

In addition to the need for cleanliness within the lithography system is the need to transport them in a clean environment. For example, one trade association, Semiconductor Equipment and Materials International (SEMI) (see www.semi.org) has adopted standards for a Standard Mechanical Interface (SMIF) for pods used to transport and store both wafers and reticles. SEMI standard E100-0302 "Specification for a Reticle SMIF Pod (RSP) Used to Transport and Store Six Inch or 230 mm Reticles" is one such standard. This specification requires that when a reticle carrier is closed, the reticle must be centered with respect to the SMIF and must be secured in all degrees of freedom within the carrier to prevent movement during transport. Typically this is accomplished in the industry by clamping all sides and faces of the reticle between many opposing knobs of a shock-absorbing material in the SMIF pod. In the case of reticles in EUV lithography, there are no pellicles to protect reticle mask areas against particles resulting from RSP contact. The inventor has determined that there is a need for a device that holds the reticle with minimal contact and can interface with a SMIF pod, in place of the reticle, to assist in centering and securing the reticle.

In addition to the need for mask cleanliness, the need for accurate location and size of features produced through lithography is directly related to the precision and accuracy of the image projected onto the wafer. The rigors of sub-100 nanometer lithography place stringent demands not only on the lithography systems performance in positioning the wafer, but also on its positioning of the reticle pattern. Reticle manufacturers place masks and patterns on their reticles within a known degree of accuracy with respect to that reticle's substrate. Trade associations such as SEMI have adopted common standards for definition of all physical characteristics of a reticle substrate, including position reference surfaces. For example, SEMI standard P37-1101"Specification for EUV Lithography Mask Substrates" is one such standard that defines all surfaces and dimensions with respect to a few small surface areas on that reticle. In order for a lithography system to establish the position of the reticle pattern accurately and precisely, it must first identify and establish the position of the substrate. The establishment of substrate position is typically a mechanical process known as registration.

In most lithography devices, the reticle is registered using a multiple-degree-of-freedom actuator device to grip and move the reticle until key features can be detected and confirmed by a multiple-degree-of-freedom sensor device. This process is contact-intensive, insufficiently accurate to achieve sub-100 nm alignment accuracy, and can take long enough to impact the productivity of the lithography system. For those reasons it is typically performed after the reticle is removed from the SMIF pod and before it is aligned to the wafer within sub-100 nm alignment accuracy. This process can be easily performed within most lithography devices because they are typically purged with clean gas and the reticles have protective pellicles. This process becomes extremely difficult in the case of an EUV lithography system, because of the lack of pellicles and the need to maintain a vacuum environment.

Another SEMI standard, SEMI E111-0303, defines the structure shown in FIGS. 1a and 1b. FIG. 1a is a top view of a reticle SMIF pod (RSP) 100 with a reticle 101. RSP 100 has four reticle contact surfaces 102 for positioning reticle 101 (only two of the contact surfaces are shown for clarity). FIG. 1b shows the reticle contact surface 102 in more detail within an enlargement area 104 corresponding to area 104 in FIG. 1a. SEMI E112-0303 discloses a similar SMIF pod structure designed to carry multiple reticles.

Correcting positioning of the reticle outside a SMIF pod with existing gripping devices causes the reticle to shift position significantly and to endure high surface stresses with every contact made. Furthermore, the reticle has to be gripped and released with every manipulation, in addition to those manipulations required to insert the reticle onto, or remove the reticle from, the device(s) within the lithography system that positions it within sub-100 nm accuracy. The inventor has found that this additional positioning effort dramatically increases the likelihood of sub-microscopic particle contamination. Thus, there is a need for an improved apparatus and method for holding and registering a reticle, within a vacuum environment, with minimal number of contacts made to that reticle.

BRIEF SUMMARY OF THE INVENTION

The invention provides an improved reticle frame structure with a variety of embodiments. In an embodiment of the invention, a device registers the reticle substrate when that reticle is loaded into it, holds and secures the reticle with its mask side down and minimal contact to it, interfaces with robotic end effectors, grippers, or the like, in place of the reticle, to enable its manipulation without extra contact, releases the reticle to the lithography system's positioning device without any actuation, and interfaces with a SMIF pod, in place of the reticle, to assist in centering and securing the reticle.

In an exemplary embodiment, a framing structure surrounds the perimeter of the reticle substrate and contacts it at the edge with precision guidance surfaces as the reticle is lowered onto the device. The reticle abuts against conical sections to correct its position and orientation along the plane of its mask surface. Spherical surfaces contact the substrate at its standardized datum reference areas. Near the intersection of the X and Y reference planes, a minimal area of the reticle face comes to rest on a spherical support surface as far away from the reticle mask as possible. This surface completes a tripod of vertical support in conjunction with the conical sections, which maintain contact with the reticle edges only. Secondary and tertiary spherical support surfaces can be provided for vertical support of the other two lateral corners of the reticle face to mitigate reticle tilt while it is being lowered onto the tripod contact points.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 1b is a detail view of a reticle contact surface of FIG. 1a.

FIG. 2b is a top view of an embodiment of a novel reticle frame showing the installation of the reticle.

FIG. 3 is a side sectional view of the embodiment of FIG. 2 showing further details of its kinematic features.

Figure 1A:
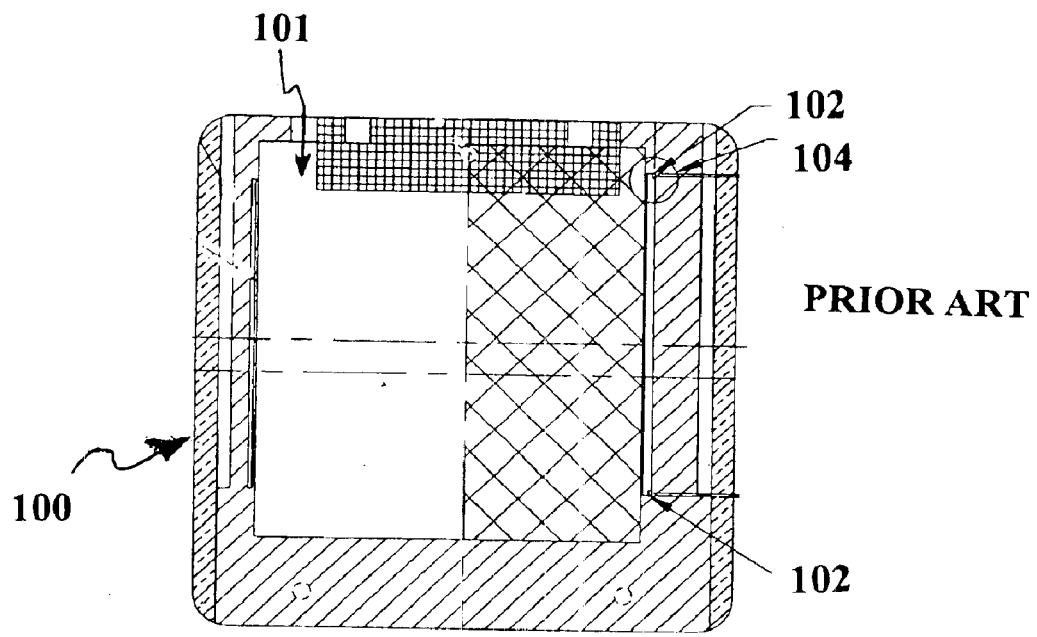
FIG. 1a is a top view of a standard reticle SMIF pod with reticle contact surfaces.
Figure 1B:
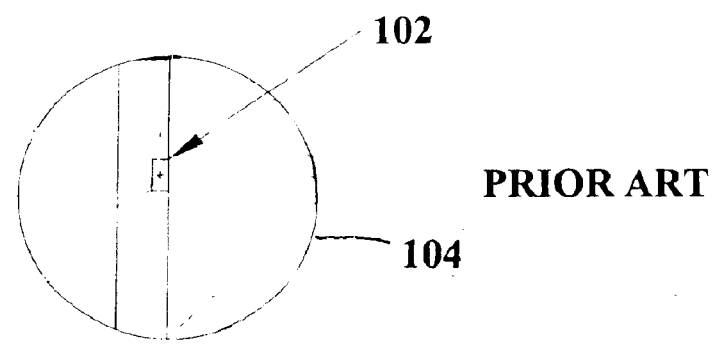

The present invention will now be described with reference to the accompanying drawings. In the drawings, some like reference numbers indicate identical or functionally similar elements. Additionally, the left-most digit(s) of most reference numbers identify the drawing in which the reference numbers first appear.

DETAILED DESCRIPTION OF SELECTED EMBODIMENTS OF THE INVENTION

Embodiments of the present invention provide, among other things, an improved reticle frame and improved methods for mounting reticles. Exemplary embodiments will now be described in detail with reference to the drawings, starting with FIGS. 2a and 2b.

Figure 2A:
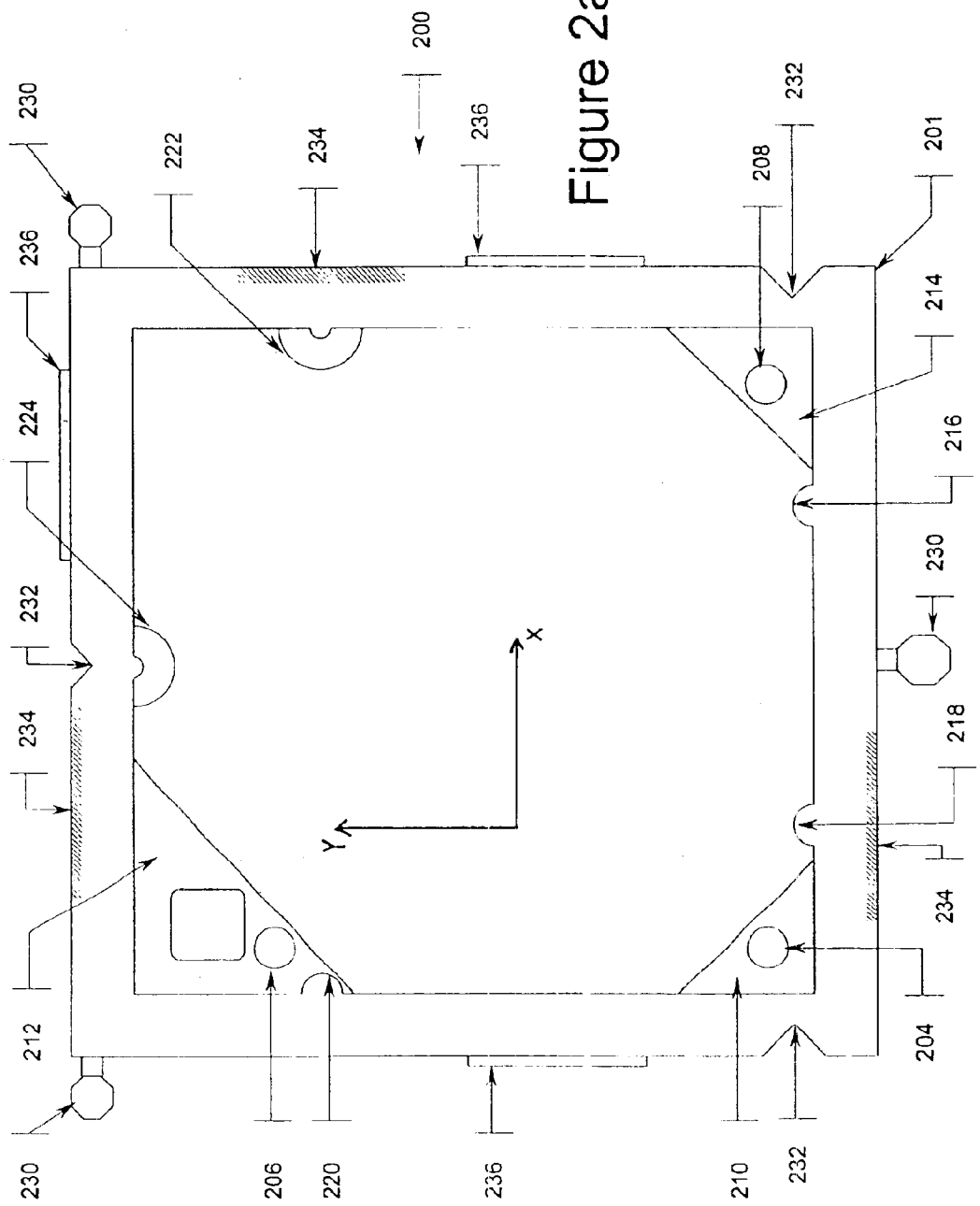
FIG. 2a is a top view of an embodiment of a novel reticle frame.

FIG. 2a illustrates a reticle gripping and registration frame 200 according to one embodiment of the present invention. FIG. 2b shows reticle frame 200, generally square in configuration, supporting a reticle 202. Reticle 202 is a flat translucent plate bearing a precision lithography mask having datum or reference sides 203 and 205 and non-datum sides 226 and 228. In this exemplary embodiment, reticle frame 200 comprises a square frame 201, primary vertical mount 204, secondary vertical mount 206, tertiary vertical mount 208, corner plates 210, 212 and 214, horizontal registration surfaces 216, 218 and 220, and angled surfaces 222 and 224.

A pattern or "mask" on the surface of reticle 202 is located on the lower face of reticle 202 at a known position relative to reference edges 203 and 205 of reticle 202. Reference edges 203 and 205 can then be used for registration of reticle 202 in the desired position in reticle frame 200.

As shown in FIG. 2a, corner plates 210, 212 and 214 are each attached to the corner of frame 201 where two inner sides of frame 201 meet. Corner plates 210, 212, and 214 increase the structural stiffness of reticle frame 200 and support vertical mounts 204, 206, and 208. Frame 201, together with corer plates 210, 212 and 214, make up a supporting structure for the above-listed positioning and mounting features. It will be understood that the invention is not limited to this supporting structure, but could use any desired supporting structure that maintains the necessary relationships of the positioning and mounting features to achieve the objectives of the invention as described herein.

Reticle frame 200 includes one or more vertical mounting surfaces for reticle 202. In this embodiment reticle frame 200 includes a primary vertical mount 204, a secondary vertical mount 206, and a tertiary vertical mount 208. Vertical mounts 204, 206 and 208 are fixed respectively onto corner plates 210, 212 and 214 that serve to distribute weight from reticle 202 to the rest of the frame 201. The height of vertical mounts 204, 206 and 208 are set precisely to provide a known vertical position for reticle 202 when inserted into reticle frame 200. Vertical mounts 204, 206 and 208 are each preferably designed to contact reticle 202 at a point, or over a small area approximating a point. As will be explained below, because of the other unique features of reticle frame 200, reticle 202 may actually contact only one or two of the vertical mounts 204, 206 and 208.

In one embodiment, vertical mounts 204, 206 and 208 are hemispherical in shape. Hemispherical vertical mounts are advantageous in this application because their contact area with reticle 202 occurs over the largest area possible while maintaining the repeatable precision of a point tangent between any sphere and plane. The advantage of increased surface area is the reduction of load stress from the weight of the reticle over the contact area. Low contact stress reduces the generation of sub-microscopic fracture particles that may ultimately become contaminants. This embodiment implements mounts having a generally spherical shape in the region of contact with reticle 202, resulting in an approximate single point of contact. The spherical shapes have relatively large radii, and produce reduced particulate contamination compared to alternatives such as needle-shaped mounting surfaces. However, the invention is in no way limited to the use of spherical region or hemispherical mounts.

Referring again to FIG. 2b, when reticle 202 is installed in reticle frame 200, reference edge 203 of reticle 202 is placed against horizontal registration surfaces 216 and 218. Reference edge 205 of reticle 202 is placed against horizontal registration surface 220. Reference edges 203 and 205 are datum surfaces in the X–Y plane and the mask on reticle 202 is located on reticle 202 in a known position relative to those datum surfaces.

Horizontal registration surfaces 216, 218 and 220 are preferably designed to contact reticle 202 at a point, or at an area approximating a point. Horizontal registration surfaces 216, 218, and 220 thus precisely register the mask of reticle 202 in a known position along the X- and Y-axes relative to reticle frame 200.

Angled surfaces 222 and 224 are provided on the sides of reticle frame 200 opposite the sides bearing horizontal registration surfaces 216, 218, and 220. Angled surfaces 222 and 224 contact reticle 202 along non-datum edges 228 and 226 respectively. The distance between edge 228 and its opposing edge 203, as well as edge 226 and its opposing edge 205, will vary within the tolerances established for the X–Y dimensions of reticle 202. Within that range of tolerance, angled surfaces 222 and 224 force reference edges 205 and 203 of reticle 202 against horizontal registration surfaces 216 & 218 and 220 using the weight of the reticle alone. In this way, reticle 202 is precisely positioned in the X and Y directions despite slight variations in X and Y reticle dimensions. Also, reticle 202 can be removed by picking it straight up from the stationary mounting features, to the extent it was set in place only by its own weight.

When reticle 202 is fully inserted into reticle frame 200, reticle 202 leans against surfaces 222 and 224 at a slight angle relative to the X–Y plane. In this way, reticle 202 is in contact with primary vertical support 204 and angled surfaces 222 and 224, forming a tripod of support. Reticle 202 is typically not in contact with vertical supports 206 and 208 during most occasions. Vertical supports 206 and 208 are, however, useful in limiting any tilt in reticle 202 during insertion and removal. Once finally positioned, reticle 202 can be clamped in all degrees of freedom if desired, by applying pressure against the upper face of the reticle using a conventional clamping device. The clamping device can be a component of the reticle stage interacting with the reticle frame 200 or a component of a robotic device for moving the reticle or a component of a standardized reticle carrier pod.

Angled surfaces 222 and 224 can have a variety of materials, shapes, sizes, and orientations but are preferably formed as a conical section. The angle of the cone can be selected within an experimentally determined functional range. As a preferable example, one useful embodiment has angled surfaces 222 and 224 with conical half-angles of 30 degrees. As another example, angled surfaces 222 and 224 can be formed as cylindrical sections tilted at angles of 30 degrees to vertical.

Referring again to FIG. 2a, the outer portion of reticle frame 200 can be provided with mounting surfaces, engagement elements, and similar features to interface with apparatus for receiving, gripping, clamping, and/or holding reticle frame 200. As one example, reticle frame 200 can have exterior features allowing it to be clamped in a Reticle SMIF Pod. Those features may preferably have shapes, materials, and dimensions conforming to the standards issued by Semiconductor Equipment and Materials International (SEMI) as noted above. As another example, reticle frame 200 can be constructed to provide external features that facilitate holding and manipulation of reticle frame 200 by a robotic device. In this case the outer portion of reticle frame 200 is provided with an engagement element designed to mate with the selected robotic device.

As one example of such engagement elements, recesses 232 can be provided on one or more sides of reticle frame 200. As another example, clamping surfaces 234 can be provided on one or more sides of reticle frame 200. Clamping surfaces 234 are datum surfaces in the material of reticle frame 200 that are machined to a specific tolerance to provide a locating point of known spatial position. As a third example, pads 236 can be mounted on one or more surfaces or sides of reticle frame 200. Pads 236 can be, for example, hardened datum surfaces machined to provide one or more clamping locations of known spatial position. All such external features must provide a precise mechanical relationship with respect to the contact points of the horizontal registration surfaces 216, 218 and 220.

The functional relationship of the angled surfaces to the positioning of the reticle can be seen more clearly in the side sectional view of FIG. 3 taken through cross-section A—A' of FIG. 2. FIG. 3 shows reticle 202 mounted in reticle frame 200, and the contact points of reticle frame 200 with vertical mount 206, horizontal registration surface 220, and angled surface 222. Preferably, angled surfaces 222 and 224 are designed to contact edges 228 and 226 at a point or a small area approximating a point. For example, angled surface 222 contacts reticle 202 at point 300.

FIG. 3 also includes a more detailed view of the contact of angled surfaces 222 with reticle 202 at point 300. Angled surface 222 is formed as a conical section with a conical half-angle θ, for example 30 degrees.

Gravity pushes the edge of the substrate of reticle 202 along the surfaces 222 and 224, allowing reticle 202 to be banked against the X and Y contact points with horizontal registration surfaces 216, 218, and 220. Thus, reticle 202 is properly registered to reticle frame 200 by its standardized datum areas regardless of variations in substrate length. Slight variations in length will only cause the non-datum sides of a slightly larger reticle 202 to rest against the angled surfaces 222 and 224 at a slight tilt above that taken by a reticle with side lengths of the minimum tolerance.

Figure 4:
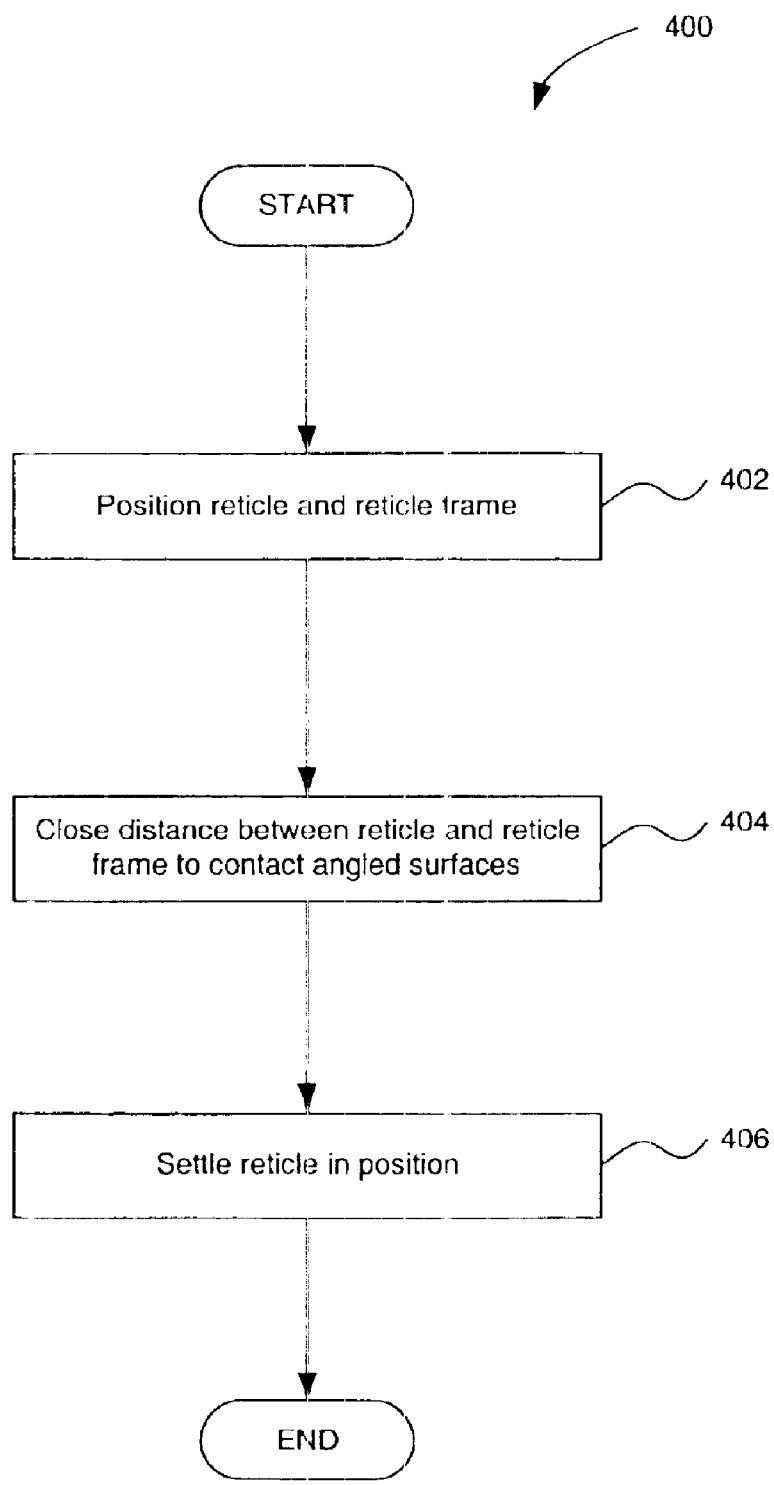
FIG. 4 is a flow chart showing a process for accurately positioning a reticle in a reticle frame in an embodiment of the invention.

FIG. 4 is a flow chart showing an embodiment of a process for mounting a reticle in a reticle frame. Process 400 begins with step 402, in which the reticle is held in a position vertically separated from frame 200, with all four edges/sides centered within the contact points of the horizontal surfaces. Next, in step 404, either the reticle or the frame or both are moved to close the distance between the reticle and reticle frame, so that the sides of the reticle contact appropriate horizontal surfaces in the frame. Finally, in step 406, the reticle is settled into position.

If the reticle is above the frame, its weight rests on the two angled surfaces and at least the primary vertical mount. Gravity and contact with the angled surface(s) induce the reticle's own weight to 'bank' the opposing sides, containing the substrate datum reference areas, against the opposing registration surface(s). While not an essential part of the positioning process disclosed herein, the reticle can also be clamped in place, if desired, by applying force down against the reticle. In a reverse process, the reticle can be removed from the frame by simply lifting it up, or by holding it upwards and lowering the frame, because the reticle was held only by gravity.

In another embodiment, where the reticle is positioned below the frame for the mounting process, it is necessary to provide a clamp or other device that provides an upward force urging the reticle against the frame, since gravity will tend to separate the reticle from the frame rather than aid in their relative positioning. The clamping device can be a separate device, or part of the reticle stage or of a robotic device for moving the reticle frame.

The present invention offers significant unobvious advantages in the mounting of reticles for use in lithography. Forming a tripod of vertical support in the manner disclosed is expected to minimize the migration of particles toward the sensitive mask area. Further, banking reticle 202 to reticle frame 200 by its datum areas allows the reticle patterns to be registered to the frame with a high degree of kinematic repeatability, minimizing positional variation of reticle 202 arising from substrate machining tolerances.

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A reticle frame for gripping and registering a lithography reticle having a substrate with a first edge that is a datum edge and a second edge on an opposite side of said substrate from said first edge, said frame comprising:
    a supporting structure;
    at least a first registration surface on said supporting structure, said first registration surface contacting the first edge of said reticle substrate to establish a desired reticle position in a first direction; and
    at least a first angled surface on said supporting structure, said first angled surface contacting a bottom portion of the second edge opposite the first edge such that said first angled surface forces the first edge of the substrate against said first registration surface.

2. The reticle frame of claim 1, wherein said first registration surface contacts the first edge at an area approximating a point.

3. The reticle frame of claim 2, wherein said first registration surface is a hemispherical surface.

4. The reticle frame of claim 1, wherein said first angled surface comprises a conical section.

5. The reticle frame of claim 1, wherein said first angled surface comprises a cylindrical section.

6. The reticle frame of claim 1, wherein the reticle has a third edge that is a datum edge and a fourth edge on an opposite side of the substrate from said third edge, and with said frame further comprising:
    a second registration surface on said supporting structure, said second registration surface contacting said third edge of said reticle substrate to establish a desired reticle position in a second direction; and
    a second angled surface on said supporting structure, said second angled surface contacting a bottom portion of said fourth edge opposite said third edge such that said angled surface forces the third edge of the substrate against said second registration surface.

7. The reticle frame of claim 6, wherein said first and second registration surfaces meet each of the first and third edges at an area approximating a point.

8. The reticle frame of claim 7, wherein said first and second registration surfaces are hemispherical surfaces.

9. The reticle frame of claim 7, wherein said first and second registration surfaces are spherical in character at the area of contact.

10. The reticle frame of claim 6, wherein a plurality of similar registration surfaces contact said reticle at each of its standardized datum areas.

11. The reticle frame of claim 6, wherein said first and second angled surfaces comprise conical sections.

12. The reticle frame of claim 6, wherein said first and second angled surfaces comprise cylindrical sections.

13. The reticle frame of claim 6, further comprising support means connected to said supporting structure for contacting a bottom surface of the substrate.

14. The reticle frame of claim 13, wherein said support means includes at least one vertical positioning element.

15. The reticle frame of claim 14, wherein at least one said vertical positioning element is a surface that is spherical in character at the area of contact.

16. The reticle frame of claim 14, wherein said first and second angled surfaces and said vertical positioning element provide a three-point mount for the reticle substrate upon placement in the reticle frame.

17. The reticle frame of claim 6, wherein said supporting structure comprises means for engaging said supporting structure with a reticle SMIF pod.

18. The reticle frame of claim 6, wherein said supporting structure comprises means for engaging said mounting structure with a robotic positioning device.

19. A reticle frame for receiving and positioning a lithography reticle having a substrate with first and second edges that are datum edges and third and fourth edges on opposite sides of the substrate from the first and second edges respectively, the frame comprising:

structural means for rigidly supporting elements of the frame;

first registration means for contacting the first edge of the reticle substrate to establish a desired reticle position in a first direction;

second registration means for contacting the second edge of the reticle substrate to establish a desired reticle position in a second direction;

first surface means for contacting a bottom portion of the third edge opposite the first edge at an acute angle, to force the first edge of the substrate against said first registration means; and second surface means for contacting a bottom portion of the fourth edge opposite the second edge at an acute angle, to force the second edge of the substrate against the second registration means.

20. The reticle frame of claim 19, wherein said second direction is perpendicular to said first direction.

21. The reticle frame of claim 19, wherein said first and second registration means respectively comprise first and second surfaces that meet each of the first and second edges at an area approximating a point.

22. The reticle frame of claim 21, wherein said first and second surfaces are spherical in character at the area approximating a point.

23. The reticle frame of claim 19, wherein said first and second surface means comprise conical sections positioned against the third edge and fourth edge respectively.

24. The reticle frame of claim 19, wherein said first and second surface means comprise cylindrical sections oriented at an angle with respect to the third and fourth edge respectively.

25. The reticle frame of claim 19, further comprising support means for supporting a bottom surface of the substrate.

26. The reticle frame of claim 25, wherein said support means includes at least one vertical positioning element.

27. The reticle frame of claim 26, wherein at least one said vertical positioning element is a surface spherical in character at an area of contact with the substrate.

28. The reticle frame of claim 26, wherein said first and second surface means and said vertical positioning element provide at least three points of support for the reticle substrate upon placement in the reticle frame.

29. The reticle frame of claim 19, wherein said structural means include means for interfacing said support structure with a reticle SMIF pod.

30. The reticle frame of claim 19, wherein said structural means comprises means for engaging the reticle frame with a robotic positioning device.

31. A method for positioning a lithography reticle in a reticle frame, the reticle having a substrate with at least two datum edges, and the reticle frame having first and second angled surfaces, horizontal datum contact features, and at least one vertical contact mount, comprising the steps of:

(1) positioning the reticle in alignment with and vertically separated from the reticle frame;

(2) closing a distance between the reticle and the reticle frame so that the reticle contacts at least the vertical contact mount and the first and second angled surfaces; and (3) settling the reticle and the reticle frame together so that the first and second angled surfaces position the two datum edges of the reticle into contact with the horizontal datum contact features of the reticle frame.

32. The method of claim 31, wherein the reticle is substantially square and wherein the two datum edges are disposed along adjacent sides of said square.

33. The method of claim 31, wherein the horizontal datum contact features are placed in contact with the datum edges over an area approximating a point.

34. The method of claim 33, wherein the horizontal datum contact features are placed in contact with the datum edges at a surface that is spherical in character at the area of contact.

35. The method of claim 31, wherein the first and second angled surfaces comprise conical sections.

36. The method of claim 31, wherein the first and second angled surfaces comprise cylindrical sections.

37. The method of claim 31, wherein in step (1) the reticle is positioned in a reticle stage above the reticle frame.

38. The method of claim 37, wherein in step (2) a robotic device moves the reticle frame upward to meet the reticle.

39. The method of claim 31, wherein in step (1) the reticle is positioned in a reticle stage below the reticle frame.

40. The method of claim 31, wherein the first and second angled surfaces and the vertical positioning element provide a three-point support for the reticle substrate upon insertion in the reticle frame.

41. The method of claim 31, comprising the further step of engaging the reticle frame with a reticle SMIF pod.

42. The method of claim 31, including the further step of engaging the reticle frame with a robotic device.

43. The method of claim 42, including the further step of moving the frame containing the reticle to a subsequent processing station using said robotic device.

* * * * *